United States Patent
Jung et al.

(10) Patent No.: US 10,243,380 B2
(45) Date of Patent: Mar. 26, 2019

(54) METHOD AND APPARATUS FOR BATTERY MALFUNCTION DETECTION AND NOTIFICATION THEREOF

(71) Applicant: Samsung Electronics Co., Ltd., Gyeonggi-do (KR)

(72) Inventors: Kuchul Jung, Seoul (KR); Sunggeun Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 14/843,800

(22) Filed: Sep. 2, 2015

(65) Prior Publication Data

US 2016/0064980 A1   Mar. 3, 2016

(30) Foreign Application Priority Data

Sep. 2, 2014  (KR) .................. 10-2014-0116078

(51) Int. Cl.
| | | |
|---|---|---|
| *H02J 7/00* | (2006.01) | |
| *G01R 31/36* | (2019.01) | |
| *H01M 10/42* | (2006.01) | |
| *H01M 10/44* | (2006.01) | |
| *G01R 31/44* | (2006.01) | |

(52) U.S. Cl.
CPC ........ *H02J 7/0047* (2013.01); *G01R 31/3662* (2013.01); *G01R 31/44* (2013.01); *H01M 10/42* (2013.01); *H01M 10/44* (2013.01); *H02J 7/007* (2013.01); *H02J 7/0031* (2013.01)

(58) Field of Classification Search
CPC ........ H02J 7/0047; H02J 7/007; H02J 7/0031; H01M 10/44; H01M 10/42; G01R 31/3662; G01R 31/44
See application file for complete search history.

(56) References Cited

U.S. PATENT DOCUMENTS

| | | | | |
|---|---|---|---|---|
| 3,811,122 | A * | 5/1974 | Raber .................. | G08B 29/181 |
| | | | | 320/DIG. 18 |
| 4,345,603 | A * | 8/1982 | Schulman ............ | A61N 1/3708 |
| | | | | 607/29 |
| 5,043,651 | A * | 8/1991 | Tamura ............ | G01R 19/16542 |
| | | | | 320/136 |
| 5,281,919 | A * | 1/1994 | Palanisamy .......... | G01R 31/007 |
| | | | | 324/427 |

(Continued)

FOREIGN PATENT DOCUMENTS

| | | | | | |
|---|---|---|---|---|---|
| JP | | 57111477 | A * | 7/1982 | ............. G01R 31/36 |
| JP | | 2001195159 | A * | 7/2001 | ............. G01R 31/36 |

(Continued)

OTHER PUBLICATIONS

Extended European Search Report issued for EP 15183497.5 dated Jan. 8, 2016, 7 pgs.

*Primary Examiner* — Naum B Levin

(57) ABSTRACT

A method of managing the charging of a battery, and an electronic device adapted to the method are provided. The method of managing the charging of a battery installed to an electronic device includes: charging the battery; obtaining an internal resistance of the charging battery; determining whether the battery is functioning based on the internal resistance; and displaying, when the battery is malfunctioning, a message related to the danger while charging the battery.

20 Claims, 7 Drawing Sheets

(56) References Cited

U.S. PATENT DOCUMENTS

| | | | | |
|---|---|---|---|---|
| 5,408,170 A * | 4/1995 | Umetsu | H02J 7/0086 | 320/148 |
| 5,477,125 A * | 12/1995 | Ettel | H02J 7/0086 | 320/156 |
| 5,705,929 A | 1/1998 | Caravello et al. | | |
| 5,751,217 A * | 5/1998 | Kchao | G01R 31/3679 | 324/426 |
| 5,767,659 A * | 6/1998 | Farley | H01M 10/46 | 320/106 |
| 5,858,570 A * | 1/1999 | Akagi | H04W 52/0261 | 429/50 |
| 6,028,415 A * | 2/2000 | Nagai | G11C 5/141 | 320/137 |
| 6,072,300 A | 6/2000 | Tsuji | | |
| 6,087,808 A * | 7/2000 | Pritchard | G01R 31/3651 | 320/132 |
| 6,307,377 B1 * | 10/2001 | Cummings | G01R 31/3651 | 320/136 |
| 6,366,056 B1 * | 4/2002 | Podrazhansky | H02J 7/0093 | 320/141 |
| 6,380,711 B2 * | 4/2002 | Fischer | H02J 7/0008 | 320/106 |
| 6,424,157 B1 * | 7/2002 | Gollomp | G01R 31/006 | 320/132 |
| 6,555,990 B1 * | 4/2003 | Yang | H02J 7/0042 | 320/113 |
| 6,563,318 B2 * | 5/2003 | Kawakami | G01R 31/3662 | 320/132 |
| 6,611,128 B2 * | 8/2003 | Minamiura | B60L 3/0023 | 320/134 |
| 6,683,440 B2 * | 1/2004 | Kawakami | G01R 31/361 | 320/133 |
| 6,838,883 B2 * | 1/2005 | Kanou | G01R 31/3662 | 324/439 |
| 6,842,708 B2 * | 1/2005 | Odaohhara | G06F 1/28 | 702/57 |
| 6,924,623 B2 * | 8/2005 | Nakamura | G01R 31/3662 | 320/132 |
| 7,135,839 B2 * | 11/2006 | Iida | H01M 10/441 | 320/149 |
| 7,205,746 B2 * | 4/2007 | Batson | H02J 7/0047 | 320/107 |
| 7,212,006 B2 * | 5/2007 | Huang | G01R 31/3662 | 324/430 |
| 7,215,096 B2 * | 5/2007 | Miura | H02J 7/0031 | 320/134 |
| 7,362,074 B2 * | 4/2008 | Iwane | G01R 31/3662 | 320/132 |
| 7,567,085 B2 * | 7/2009 | Kim | G01R 31/3662 | 324/426 |
| 7,626,394 B2 * | 12/2009 | Kimura | G01R 31/3624 | 320/132 |
| 7,710,073 B2 * | 5/2010 | Yamauchi | H01M 10/42 | 320/128 |
| 7,928,735 B2 * | 4/2011 | Huang | B60L 11/1857 | 320/132 |
| 8,255,176 B2 * | 8/2012 | Plestid | G01R 31/3679 | 320/128 |
| 8,502,494 B2 * | 8/2013 | Nieh | H01M 4/525 | 320/101 |
| 8,610,408 B2 * | 12/2013 | Nakai | H01M 4/485 | 320/160 |
| 8,769,327 B2 * | 7/2014 | Lu | H02J 7/007 | 320/107 |
| 9,018,897 B2 * | 4/2015 | Nakamura | G01R 31/3624 | 320/107 |
| 9,093,855 B2 * | 7/2015 | Zhu | H02J 7/0055 | |
| 9,267,994 B2 * | 2/2016 | Plestid | G01R 31/3679 | |
| 9,496,727 B2 * | 11/2016 | Liu | G01R 31/3662 | |
| 9,496,740 B2 * | 11/2016 | Beckman | H02J 7/0021 | |
| 9,502,917 B2 * | 11/2016 | Xiang | H02J 7/0077 | |
| 2002/0161537 A1 * | 10/2002 | Odaohhara | G01D 4/004 | 702/62 |
| 2003/0020434 A1 | 1/2003 | Fukuoka et al. | | |
| 2004/0145352 A1 * | 7/2004 | Harrison | H02J 7/0029 | 320/150 |
| 2005/0046393 A1 * | 3/2005 | Nakasho | H02J 7/0045 | 320/150 |
| 2011/0089907 A1 | 4/2011 | Bhardwaj et al. | | |
| 2012/0121952 A1 * | 5/2012 | Majima | G01R 31/3679 | 429/90 |
| 2013/0069594 A1 * | 3/2013 | Jung | H01M 10/425 | 320/112 |
| 2013/0245973 A1 * | 9/2013 | Ross, Jr. | G01R 31/3627 | 702/63 |
| 2013/0325379 A1 * | 12/2013 | Nakamura | G01R 31/362 | 702/63 |
| 2014/0167705 A1 * | 6/2014 | Chang | H02J 7/0021 | 320/157 |
| 2016/0020618 A1 * | 1/2016 | Yang | H02J 7/022 | 320/162 |
| 2016/0084913 A1 * | 3/2016 | Lupo | G01R 31/3624 | 702/63 |
| 2016/0105054 A1 * | 4/2016 | Horito | H01M 10/425 | 320/134 |

FOREIGN PATENT DOCUMENTS

| | | |
|---|---|---|
| KR | 20000014310 A | 3/2000 |
| KR | 101307480 B1 | 9/2013 |
| KR | 20140005518 A | 1/2014 |

* cited by examiner

METHOD AND APPARATUS FOR BATTERY MALFUNCTION DETECTION AND NOTIFICATION THEREOF

CROSS-REFERENCE TO RELATED APPLICATION(S) AND CLAIM OF PRIORITY

The present application is related to and claims the benefit under 35 U.S.C. § 119(a) of a Korean patent application filed on Sep. 2, 2014, in the Korean Intellectual Property Office and assigned Serial No. 10-2014-0116078, the entire disclosure of which is hereby incorporated by reference.

TECHNICAL FIELD

Various embodiments of the present disclosure relate to a method of managing the charging of a battery, and an electronic device adapted to the method.

BACKGROUND

Portable electronic devices such as smartphones, tablet PCs, etc. are connected to external systems through, for example, a USB cable, and the batteries are charged with electric power from the external systems. The life span of batteries (e.g., Lithium-ion batteries and Lithium polymer batteries) shortens as the charging and discharging processes are repeated. That is, the time that a battery can be used is reduced. The internal cells of batteries are damaged by external impact. When a battery is nearly to a limited life or is damaged, which is called a 'malfunctioning battery,' the time that the battery can be used is extremely shortened. When a malfunctioning battery is charged, a swelling (a phenomenon that a battery swells) or an explosion may occur.

SUMMARY

Various embodiments of the present disclosure provide a method of managing the charging of a battery and an electronic device adapted to a method that informs the user of a malfunctioning state of a battery and prevents battery-related accidents.

To address the above-discussed deficiencies, it is a primary object to provide a method of managing the charging of a battery installed to an electronic device comprising: charging the battery; obtaining an internal resistance of the charging battery; determining whether the battery is functioning based on the internal resistance; and displaying, when the battery is malfunctioning, a message related to the danger while charging the battery.

In accordance with another embodiment of the present disclosure, the present disclosure provides an electronic device comprising: a battery; an interface unit configured to receive a charging current from an external device; a power management unit configured to charge the battery with the charging current; a resistance obtaining unit configured to obtain an internal resistance of the battery in charging; a display; and a controller configured to determine whether the battery is functioning based on the internal resistance; and controlling, when the battery is malfunctioning, the display to display a message related to the danger while charging the battery.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
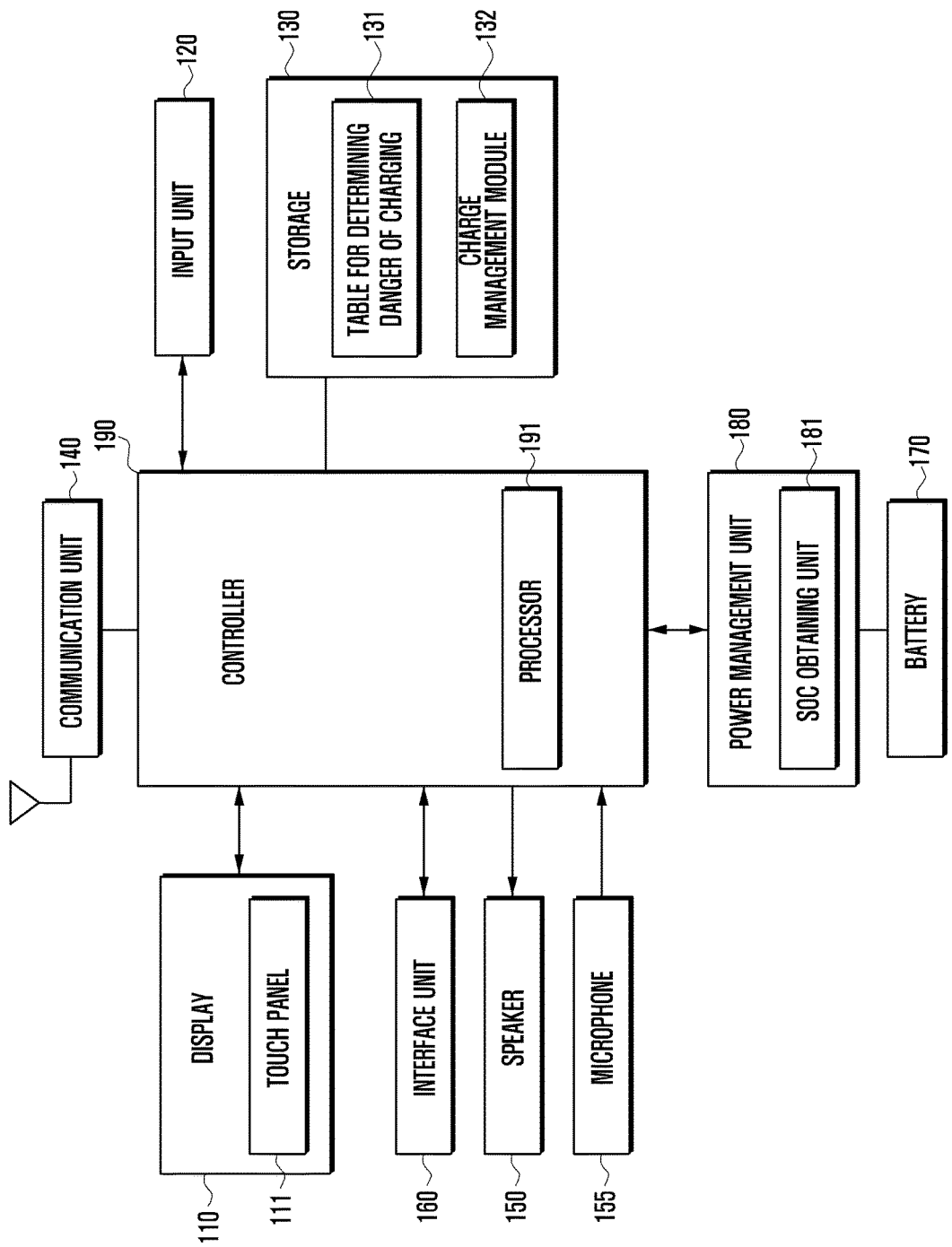
FIG. 1 illustrates a block diagram of an electronic device according to various embodiments of the present disclosure.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Hereinafter, various embodiments of the present disclosure are described with reference to the accompanying drawings. Various embodiments of the present disclosure may have various embodiments, and modifications and changes may be made therein. Therefore, the present disclosure will be described in detail with reference to particular embodiments shown in the accompanying drawings. However, it should be understood that there is no intent to limit the present disclosure to the particular forms, and the present disclosure should be construed to cover all modifications, equivalents, and/or alternatives falling within the spirit and scope of the present disclosure.

As used in various embodiments of the present disclosure, the expression "include" or "may include" refers to the existence of a corresponding function, operation, or constituent element, and does not limit one or more additional functions, operations, or constituent elements. Further, as used in various embodiments of the present disclosure, the term such as "include" or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

While expressions including ordinal numbers, such as "first" and "second," as used in various embodiments of the present disclosure may modify various constituent elements, such constituent elements are not limited by the above expressions. For example, the above expressions do not limit the sequence and/or importance of the corresponding constituent elements. The above expressions may be used merely for the purpose of distinguishing a constituent element from other constituent elements. For example, a first user device and a second user device indicate different user devices although both are user devices. For example, a first constituent element may be termed a second constituent element, and likewise a second constituent element may also be termed a first constituent element without departing from the scope of the present disclosure.

When a component is referred to as being "connected" or "accessed" to any other component, it should be understood that the component may be directly connected or accessed to the other component, but another new component may also be interposed between them. Contrarily, when a component is referred to as being "directly connected" or "directly accessed" to any other component, it should be understood that there is no new component between the component and the other component.

The terms as used in various embodiments of the present disclosure are merely for the purpose of describing particular embodiments and are not intended to limit the present disclosure. Singular forms are intended to include plural forms unless the context clearly indicates otherwise.

Unless defined otherwise, all terms used herein, including technical terms and scientific terms, have the same meaning as commonly understood by a person of ordinary skill in the art to which the present disclosure pertains. Such terms as those defined in a generally used dictionary are to be interpreted to have the meanings equal to the contextual meanings in the relevant field of art, and are not to be interpreted to have ideal or excessively formal meanings unless clearly defined in various embodiments of the present disclosure.

An electronic device according to various embodiments of the present disclosure may be a device including a battery charging function. For example, the electronic device may include at least one of the following: a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and a wearable device (e.g., a head-mounted-device (HMD) such as electronic glasses, electronic clothes, an electronic bracelet, an electronic necklace, an electronic appcessory, electronic tattoos, or a smartwatch).

According to some embodiments, the electronic device may be a smart home appliance with a communication function. The smart home appliance as the electronic device, for example, may include at least one of the following: a television, a digital video disk (DVD) player, an audio device, a refrigerator, an air conditioner, a vacuum cleaner, an oven, a microwave oven, a washing machine, an air cleaner, a set-top box, a TV box (e.g., SAMSUNG HOMESYNC, APPLE TV, or GOOGLE TV), a game console, an electronic dictionary, an electronic key, a camcorder, and an electronic photo frame.

According to certain embodiments, the electronic devices may include at least one of the following: various medical devices (e.g., magnetic resonance angiography (MRA), magnetic resonance imaging (MRI), computed tomography (CT), and ultrasonic machines), navigation equipment, a global positioning system (GPS) receiver, an event data recorder (EDR), a flight data recorder (FDR), an automotive infotainment device, electronic equipment for ships (e.g., ship navigation equipment and a gyrocompass), avionics, security equipment, a vehicle head unit, an industrial or home robot, an automatic teller machine (ATM) of a banking system, and a point of sales (POS) in a shop.

According to some embodiments, the electronic device may include at least one of the following: a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. Further, the electronic device according to various embodiments of the present disclosure may be a flexible device. Further, it will be apparent to those skilled in the art that the electronic device according to various embodiments of the present disclosure is not limited to the aforementioned devices.

Hereinafter, an electronic device according to various embodiments of the present disclosure will be described with reference to the accompanying drawings. The term a "user" as used in various embodiments may refer to any person who uses an electronic device or any other device (e.g., an artificial intelligence electronic device) using an electronic device.

FIG. 1 depicts a block diagram of an electronic device according to various embodiments of the present disclosure.

Referring to FIG. 1, the electronic device 100 may include a display 110, an input unit 120, a storage 130, a communication unit 140, a speaker 150, a microphone 155, an interface unit 160, a battery 170, a power management unit 180 and a controller 190.

The display 110 may display variety of information on the screen under the control of the controller 190. The display may include a display panel or a hologram unit. The display panel may be, for example, a liquid-crystal display (LCD), an active matrix-organic light emitting diode (AM-OLED), etc. The display panel may be implemented to be, for example, flexible, transparent, or wearable. The display panel may also include a touch panel 111, as an input device, for performing an interaction between the user and the electronic device 100. In that case, the display 110 may be called a touch screen.

The touch panel 111 may be implemented with an add-on type of touch panel placed on the screen of the display 110.

The touch panel 111 may also be implemented with an on-cell type of touch panel or in-cell type of touch panel which is inserted into the display 110. The touch panel 111 may be implemented with at least one of the following: a capacitive type, a resistive type, an infra-red type and an ultrasonic type. The touch panel 111 may detect a user's inputs, create event signals corresponding to the user's inputs and transfer the signals to the controller 190. The hologram unit may show a three-dimensional image in the air using interference of light. The display 110 may further include a control circuit for controlling the display panel or the hologram unit.

The input unit 120 may be a device that differs from the touch panel 111 of the display 110 and may include a touch key. The touch key may sense the contact or proximity of a user's body and an object. The input unit 120 may create an event signal in response to a user's input and transfer the signal to the controller 190. The input unit 120 may also be implemented with another type other than the touch type. For example, the input unit 120 may be implemented with at least one dome key. If the user presses down the dome key, the dome key may be deformed so that it contacts the PCB and thus an event occurs on the PCB and the event signal may be transferred to the controller 190.

The storage 130 stores data created in the electronic device 100 or data received from external devices through the communication unit 140, under the control of the controller 190. The storage 130 stores a booting program, one or more operating systems (OSs) and applications. The storage 130 may also store setting information items (e.g., screen brightness) for setting the use environment of the electronic device 100. The controller 190 may manages the electronic device 100 referring to the setting information items.

The storage 130 may include a main memory and a secondary memory. The main memory may be implemented with, for example, RAM, etc. The secondary memory may be implemented with a disk, RAM, ROM, flash memory, etc. The main memory may store various programs loaded from the secondary memory, e.g., booting program, OS, and applications. If the electronic device 100 is turned on, the booting program may be loaded on the main memory under the control of the controller 190. The booting program may load the OS on the main memory. The OS may load applications on the main memory. The controller 190 may access the main memory, decode instructions (routines) of programs, and execute functions corresponding to the decoded results.

The storage 130 may further include external memories, e.g., a compact flash (CF), a secure digital (SD), a micro-secure digital (Micro-SD), a mini-secure digital (Mini-SD), an extreme digital (xD), a memory stick, etc.

The storage 130 may include a table 131 for determining the danger while charging.

Figure 2A:
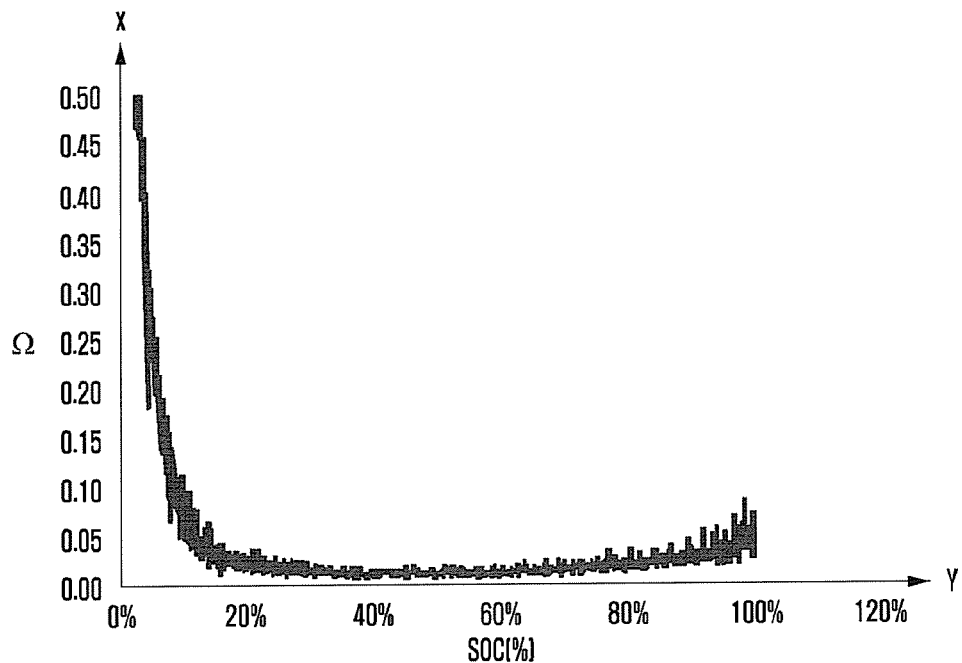
FIGS. 2A and 2B illustrates diagrams that describe a difference between functioning and malfunctioning batteries according to various embodiments of the present disclosure.
Figure 2B:
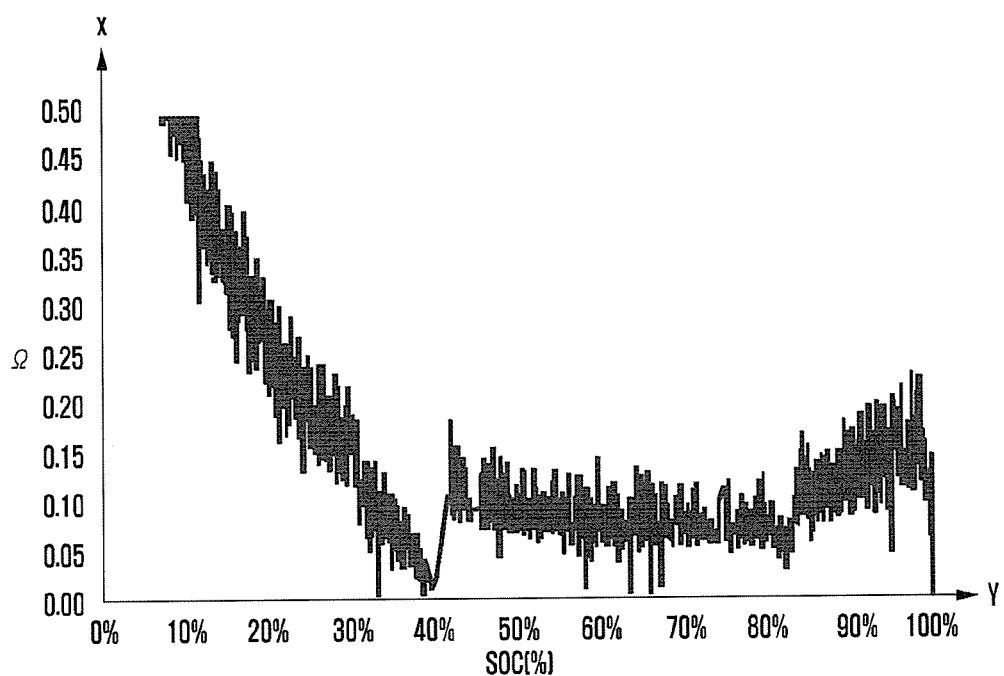

FIGS. 2A and 2B are diagrams that describe a difference between functioning and malfunctioning batteries. More specifically, FIG. 2A is a graph showing the state of charge (SOC) of a functioning battery and FIG. 2B is a graph showing the SOC of a malfunctioning battery. The X-axis denotes the SOC and Y-axis denotes the internal resistance.

As shown in FIGS. 2A and 2B, the malfunctioning battery has a larger internal resistance than the functioning battery. If the electronic device 100 has already had information about a range of internal resistance of a functioning battery and a range of internal resistance of a malfunctioning battery (hereafter called information about a resistance range), it may determine whether the battery 170 is functioning based on the information about a resistance range and the internal resistance of the battery 170.

The table 131 contains information about resistance ranges an example of which is shown in the following table 1.

TABLE 1

| State of battery | | Internal resistance range [mΩ] |
|---|---|---|
| | Functioning | 30~100 |
| Malfunctioning | Low level of danger: close to the limited life | 100~300 |
| | High level of danger 1: possible to swell | 300~500 |
| | High level of danger 2: possible to explode | Over 500 |

The malfunctioning battery has a larger internal resistance than the functioning battery. Therefore, the internal temperature of the malfunctioning battery may be higher than that of the functioning battery. The table 131 may contain information about a range of internal temperature of a functioning battery and a range of internal temperature of a malfunctioning battery (hereafter called information about a temperature range). In the table 131, the internal resistance ranges may correspond to the internal temperature ranges respectively. The electronic device 100 searches for an internal temperature range corresponding to an obtained, internal resistance from the table 131, and may determine whether the battery 170 is functioning based on the searched internal temperature range.

Referring back to FIG. 1, the storage 130 may include a charge management module 132. The charge management module 132 may be set to allow the controller 190 to perform: a function for obtaining an internal resistance of the battery 170; a function for determining whether the battery 170 is in danger while charging based on the obtained internal resistance and the table 131; a function for displaying, if the battery 170 is in danger while charging, a message related to the danger while charging; and a function for performing, if the battery 170 is in danger while charging, a process for reducing the danger corresponding to the obtained internal resistance. In addition, the charge management module 132 may include a function for obtaining an internal temperature of the battery 170. In certain embodiments, the controller 190 may also perform a process for reducing the danger corresponding to the obtained internal temperature.

The communication unit 140 may make voice call or data communication with external devices through a network, under the control of the controller 190. The communication unit 140 may include a mobile communication module (e.g., a 3-Generation (3G) mobile communication module, 3.5G, 4G, etc.), a digital broadcasting module (e.g., a DMB module), and a short-range communication module (e.g., Wi-Fi module, BLUETOOTH module, and Near Field Communication (NFC) module).

The speaker 150 converts audio signals transferred from the controller 190 into sound wave and outputs the converted sounds.

The microphone 155 converts sound wave from sound sources, e.g., human, etc., into audio signals and transfers the signals to the controller 190.

The interface unit 160 connects an external device to the controller 190. The interface unit 160 may include, for example, a universal serial bus (USB). The controller 190 may perform data communication with an external device (e.g., a headset) through the interface unit 160. The controller 190 may receive charging current from an external device (e.g., a travel adapter) through the interface unit 160 and may supply it to the power management unit 180. The power management unit 180 may charge the battery 170 with the receiving charge current.

The battery 170 may store or generate electric energy and may supply the stored or generated electric energy to the electronic device 100. The battery 170 may include, for example, a lithium-ion battery.

The power management unit 180 may manage electric power of the electronic device 100. Although it is not shown, the power management unit 180 may include a power management integrated circuit (PMIC) and a charger integrated circuit (IC). The PMIC may be implemented in the form of IC chip or SoC. The charger IC may charge the battery 170 and may prevent over-voltage or over-current from inputting to the battery 170 from a charger. In various embodiments, the charger IC may include an IC for performing charging in a wired charging mode and/or a wireless charging mode. Examples of the wireless charging mode are a magnetic resonance mode, a magnetic induction mode, an electromagnetic mode, etc. If the charger IC is implemented with a wireless charging type of IC, it may include an additional circuit for wireless charging, e.g., a coil loop, a resonance circuit, a rectifier, etc.

The power management unit 180 may include a state of charge (SOC) obtaining unit 181. The SOC obtaining unit 181 may obtain (detect) information about a state of charge, e.g., battery remaining amount, voltage level, charging current, internal resistance, internal temperature of the battery 170, etc. The SOC obtaining unit 181 may be a part of the charger IC. The SOC obtaining unit 181 may include a battery or fuel gauge.

In various embodiments, the SOC obtaining unit 181 detects a charging current 'I' flowing to the battery 170. The SOC obtaining unit 181 detects the voltage of the battery 170 in charging, 'V1.' The SOC obtaining unit 181 may obtain (calculate) an internal resistance of the battery 170, 'R,' though the detected current 'I' and voltage 'V1' and the formula 'V0+(I×R)=V1, and may transfer the internal resistance to the controller 190. V0 may be a preset average voltage of the battery 170 (e.g., a nominal voltage of the battery 170). In certain embodiments, the nominal voltage may refer to an average voltage (e.g., 3.8 V) if a functioning battery has 10~90% of the battery remaining capacity.

In various embodiments, part of the functions of the SOC obtaining unit 181 (e.g., a function for obtaining an internal resistance R) may be performed by the controller 190 (e.g., an application processor). For example, if the power management unit 180 transfers the detected current 'I' and voltage 'V1' to the controller 190, the controller 190 may calculate the internal resistance by using the mathematical formula described above.

In various embodiments, a function of the SOC obtaining unit 181 for obtaining an internal temperature may be performed by the controller 190. For example, if the power management unit 180 transfers the detected current 'I' and voltage 'V1' to the controller 190, the controller 190 may calculate the internal resistance by using the mathematical formula described above. The controller 190 may search for an internal temperature (or an internal temperature range) corresponding to the calculated internal resistance from the table 131.

The voltage of the battery 170 varies depending on the remaining capacity of the battery 170. That is, the more the remaining capacity of the battery 170 the higher the voltage of the battery 170. In various embodiments, the SOC obtaining unit 181 may detect 'V0.' For example, the SOC obtaining unit 181 may detect the voltage of the battery 170 before charging current 'I' flows into the battery 170 and may set the detected voltage as 'V0' for the mathematical formula.

The controller 190 controls the entire operation of the electronic device 100 and the signal flow between the components in the electronic device 100. The controller 190 may also perform data processing. The controller 190 controls the supply of power from the battery 170 to the components. The controller 190 may include a processor 191. The controller 190 may include an application processor (AP), a communication processor (CP), an audio processor, and a Graphic Processing Unit (GPU). The processor 191 may implement a battery charge processing method by using the charge management module 132. In the following description, a method of managing the charging of a battery according to various embodiments of the present disclosure is described in detailed.

Although it is not shown in the drawings, it should be understood that the electronic device 100 may further include a vibration motor, a proximity sensor, an illuminance sensor, a GPS receiving module, etc.

Figure 3:
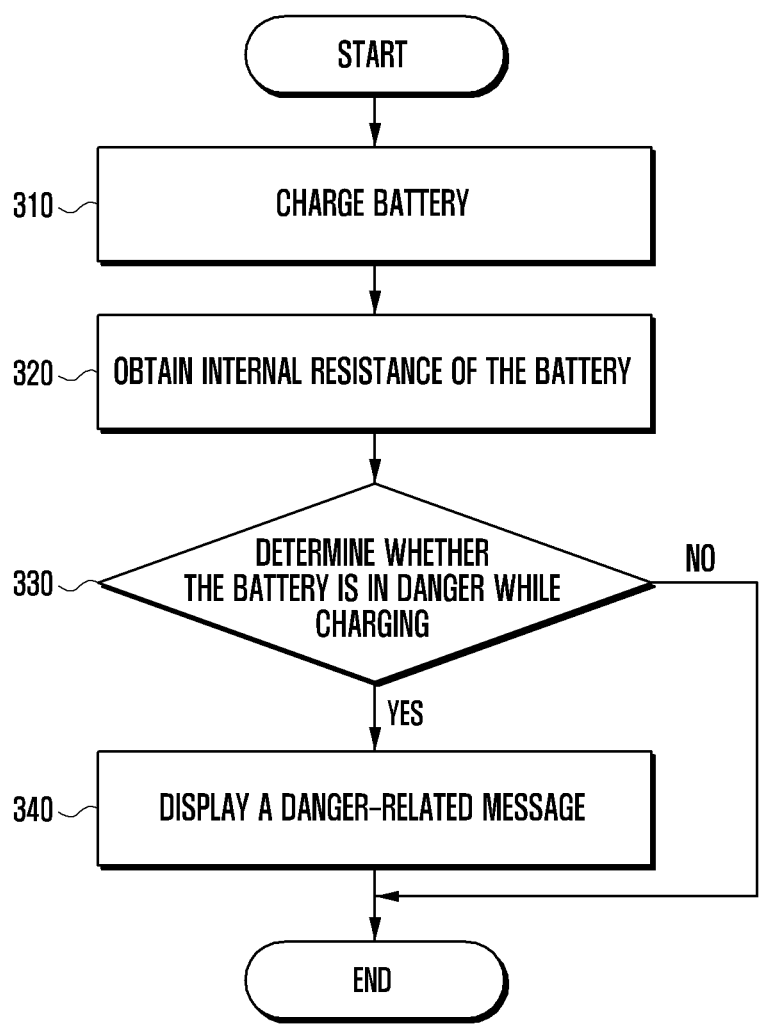
FIG. 3 illustrates a method of managing the charging of a battery according to a first embodiment of the present disclosure.
Figure 4:
FIG. 4 illustrates a screen showing the danger while charging a battery according to the method of managing the charging of a battery shown in FIG. 3 according to various embodiments of the present disclosure.

FIG. 3 is a flow diagram that describes a method of managing the charging of a battery according to a first embodiment of the present disclosure. FIG. 4 is a diagram illustrating a screen showing the danger while charging a battery according to the method of managing the charging of a battery shown in FIG. 3.

Referring to FIG. 3, the controller 190 controls the power management unit 180 to charge the battery 170 in operation 310.

The controller 190 obtains an internal resistance of the battery 170 in operation 320. For example, the controller 190 may receive an internal resistance from the power management unit 180. As another example, the controller 190 may receive the voltage and current related to the battery 170 from the power management unit 180 and may calculate the internal resistance of the battery 170 by using the current and voltage.

The controller 190 compares the obtained internal resistance with a value in the table 131 and determines whether the battery 170 is in a danger while charging (or the battery 170 is in a functioning state) in operation 330. For example, if the obtained internal resistance is within a range of resistance preset for a functioning state, the controller 190 ascertains that the charging of the battery 170 is not dangerous. On the contrary, if the obtained internal resistance is out of a range of resistance preset for a functioning state, the controller 190 ascertains that the charging of the battery 170 is dangerous.

If the controller 190 ascertains that the battery 170 is in a danger while charging in operation 330, it controls the display 110 to display a danger-related message in operation 340. The controller 190 may display messages that differ in content from each other according to the degree of danger. Referring to table 1, if an obtained internal resistance corresponds to a 'battery close to the limited life' within an internal resistance range, the controller 190 may display a passage 'Please replace battery' as shown in FIG. 4. If an obtained internal resistance is within an internal resistance range for a 'high level of danger,' the controller 190 may display a passage 'Battery in a dangerous state.'

Alternatively or additionally, the controller 190 may also output audible information (e.g., voice data or audio data) related to the danger while charging to the speaker 150 (or a headset if it is connected to the controller 190). If the electronic device 100 is equipped with a vibration motor, the controller 190 may activate the vibration motor if the battery is in a dangerous state. That is, the controller 190 may provide tactile information to the user.

Figure 5:
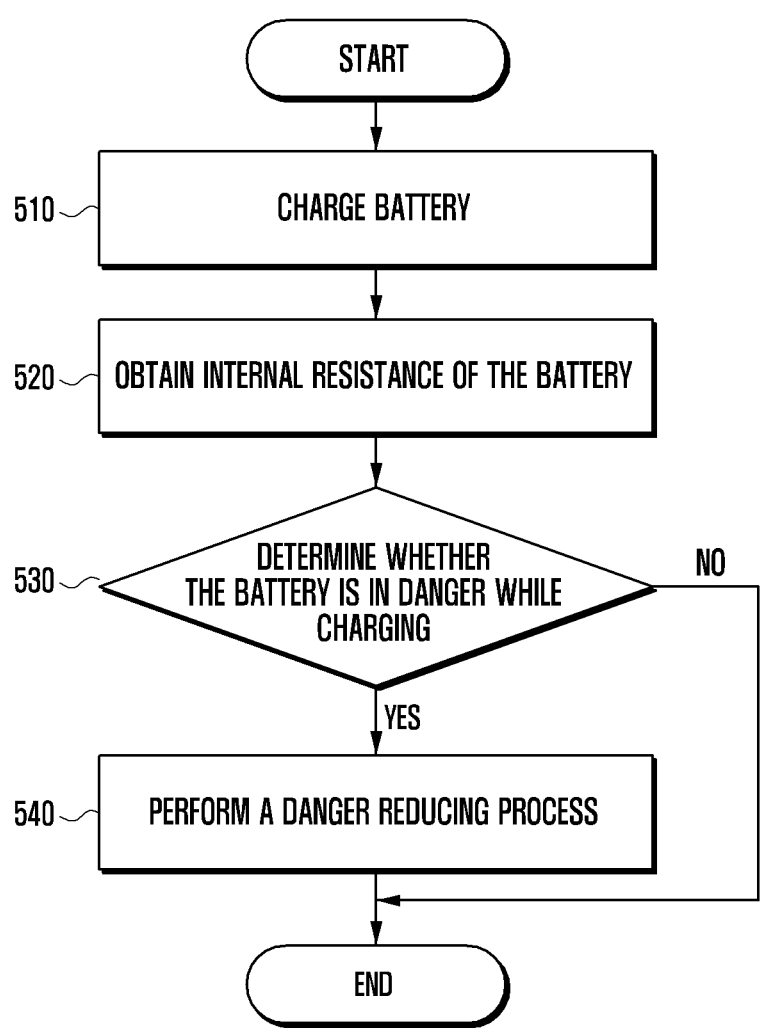
FIG. 5 illustrates a method of managing the charging of a battery according to a second embodiment of the present disclosure.

FIG. 5 is a flow diagram that describes a method of managing the charging of a battery according to a second embodiment of the present disclosure.

Referring to FIG. 5, the controller 190 controls the power management unit 180 to charge the battery 170 in operation 510.

The controller 190 obtains an internal resistance of the battery 170 in operation 520.

The controller 190 compares the obtained internal resistance with a value in the table 131 and determines whether the battery 170 is in a danger while charging in operation 530.

If the controller 190 ascertains that the battery 170 is in a dangerous state in operation 530, it performs a process for reducing the danger (or a danger reducing process) in operation 540. The danger reducing process may vary according to the obtained internal resistances. An example of the danger reducing process will be described referring to FIG. 6. If the controller 190 ascertains that the battery 170 is in danger while charging, it controls the display 110 to display a danger-related message.

Figure 6:
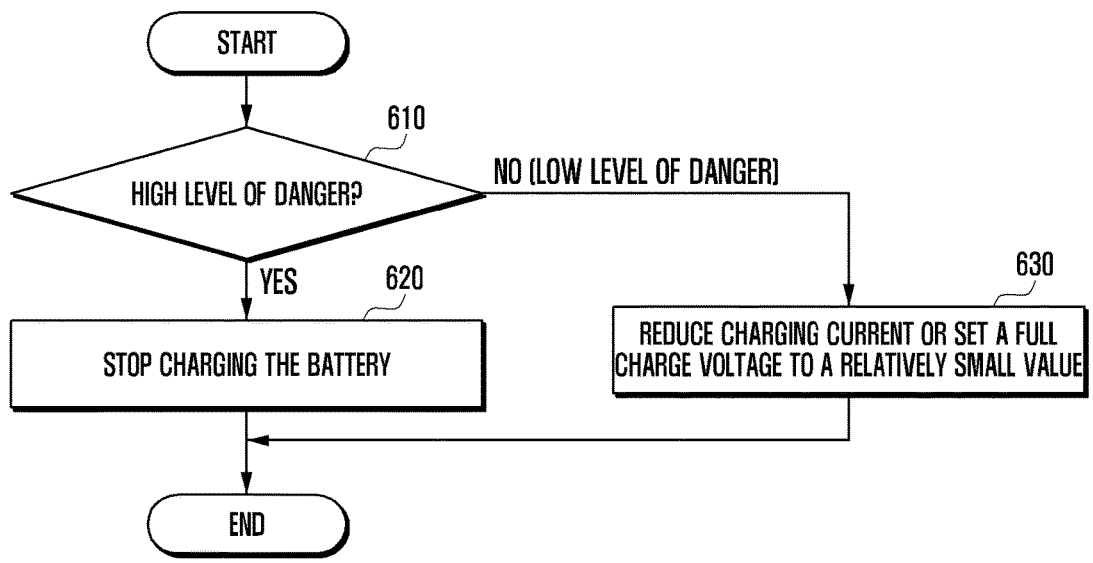
FIG. 6 illustrates a process of reducing the danger while charging a battery according to various embodiments of the present disclosure.

FIG. 6 is a flow diagram that describes a process of reducing the danger while charging a battery according to various embodiments of the present disclosure.

Referring to FIG. 6 and table 1, the controller 190 determines whether the battery 170 is in a high level of danger in operation 610.

If the controller 190 ascertains that the battery 170 is in a high level of danger in operation 610, it controls the power management unit 180 to stop charging the battery 170 in operation 620. Therefore, the danger related to the battery 170 is prevented. In addition, the controller 190 may control the display 110 to display visual information to inform the user that the charging of the battery 170 is stopped. The controller 190 may also output, through the speaker 150, audible information to inform the user that the charging of the battery 170 is stopped. The controller 190 may drive a vibration motor (not shown) to provide the user with tactile information to inform the user that the charging of the battery 170 is stopped.

On the contrary, if the controller 190 ascertains that the battery 170 is not in a high level of danger or is in a low level of danger, in operation 610, it may control the power management unit 180 to reduce the charging current in operation 630. For example, the power management unit 180 may reduce the amount of current flowing to the battery 170 from an external system. In certain embodiments, it takes a long time to fully charge the battery 170; therefore the power management unit 180 can safely charge a battery, especially, a malfunctioning battery.

In certain embodiments, the controller 190 may set a full charge voltage to a relatively small value in operation 630. For example, if the battery 170 has a preset full charge voltage of 4.2 V, the controller 190 may reset a voltage value less than 4.2 V, e.g., 4.0 V, to the full charge voltage and transfer the reset value, 4.0 V, to the power management unit 180. If the power management unit 180 detects that the voltage of the battery 170 reaches 4.0 V, it may stop charging the battery 170. Therefore, although the battery 170 has not been fully charged, the power management unit 180 can safely charge a battery, especially, a malfunctioning battery.

A battery charging method may include a constant current (CC) charging method and a constant voltage (CV) charging method. The CC charging method may refer to a method of charging a battery with a constant current (e.g., 1 A). The CV charging method may refer to a method that charges a battery in such a way that if a voltage of the battery reaches a particular voltage (e.g., 4.2 V) or the charging amount of battery reaches a preset level (e.g., 90%), the particular voltage is kept and the charging current flowing into the battery 170 is reduced. For example, if the charging current is 50 mA, the power management unit 180 determines that the battery 170 has been fully charged and may terminate the charging of the battery 170 according to the CV charging method. According various embodiments, if the battery 170 is in a malfunctioning state (e.g., a low level of danger), the controller 190 may control the power management unit 180 to charge the battery 170 through only a CC charging method. Therefore, although the battery 170 has not been fully charged, the power management unit 180 can safely charge a battery, especially, a malfunctioning battery.

According to the danger reducing process described above, the internal resistance of the battery 170 may be reduced during the charging process. Therefore, the degree of reduction in life span of the battery 170 can be lowered. In addition, the danger related to the battery is prevented.

Additionally, the controller 190 may inform the user that the danger reducing process is in operation. For example, visual information, audible information or tactile information related to the process may be output from the electronic device 100.

If a malfunctioning battery is in use (i.e., if the electronic device 100 is supplying electric power from the malfunctioning battery to other components), it may cause a dangerous situation. Therefore, according to various embodiments, if the controller 190 ascertains that the battery 170 in charging is in a malfunctioning state (e.g., a high level of danger), it automatically turns off the electronic device 100.

Figure 7:
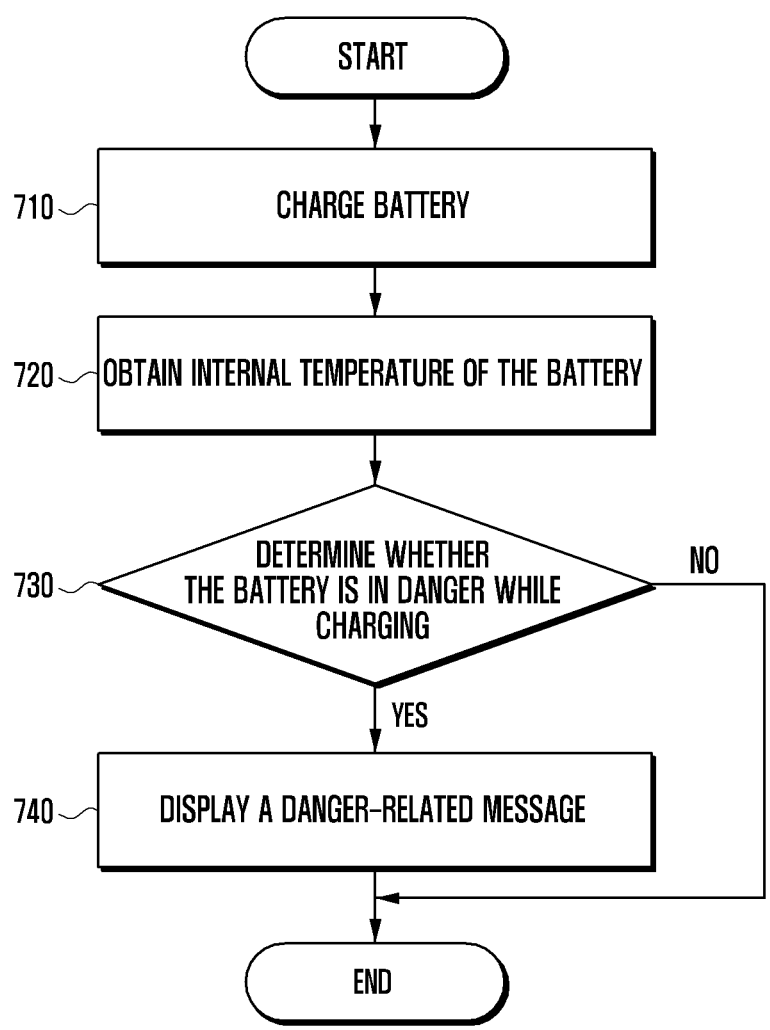
FIG. 7 illustrates a method of managing the charging of a battery according to a third embodiment of the present disclosure.

FIG. 7 is a flow diagram that describes a method of managing the charging of a battery according to a third embodiment of the present disclosure.

Referring to FIG. 7, the controller 190 controls the power management unit 180 to charge the battery 170 in operation 710.

The controller 190 obtains an internal temperature of the battery 170 in operation 720. For example, the controller 190 may receive an internal temperature from the power management unit 180 (e.g., a SOC obtaining unit 181).

The controller 190 determines whether the battery 170 is in danger while charging in operation 730. For example, if the obtained internal temperature is within a range of temperature preset for a functioning state, the controller 190 ascertains that the charging of the battery 170 is not dangerous. On the contrary, if the obtained internal temperature is out of a range of temperature preset for a functioning state, the controller 190 ascertains that the charging of the battery 170 is dangerous.

If the controller 190 ascertains that the battery 170 is in danger while charging in operation 730, it controls the display 110 to display a danger-related message in operation 740. The controller 190 may display messages that differ in content from each other according to the degree of danger. In addition, the controller 190 may perform a process for reducing the danger (or a danger reducing process) in operation 740. The danger reducing process may vary according to the obtained internal temperatures. For example, if an obtained internal temperature is within an internal temperature range for a low level of danger, the controller 190 may control the power management unit 180 to reduce the charging current flowing into the battery 170 or to stop charging the battery 170 before the battery 170 is fully charged. If an obtained internal temperature is within an internal temperature range for a high level of danger, the controller 190 may control the power management unit 180 to stop charging the battery 170.

According to various embodiments, the controller 190 may receive an internal resistance from the power management unit 180. The controller 190 may receive the voltage and current related to the battery 170 from the power management unit 180 and may calculate the internal resistance of the battery 170 by using the current and voltage. The controller 190 may identify an internal temperature range in the table 131 corresponding to an internal resistance transmitted from the power management unit 180 (or an internal resistance calculated by the controller 190). If the controller 190 ascertains that the identified internal temperature range is a normal temperature range, it may determine that the charging of the battery 170 is not dangerous. If the controller 190 ascertains that the identified internal temperature range is not a normal temperature range, it may determine that the charging of the battery 170 is dangerous.

The present disclosure may provide a method of managing the charging a battery and an electronic device adapted to the method that can inform the user a condition whether a battery is malfunctioning and prevents the battery-related accident.

The term 'module' as used in various embodiments of the present disclosure means a unit including one of hardware, software, and firmware or any combination of two or more of them. The 'module' may be interchangeable with the term 'unit,' 'logic,' 'logical block,' 'component,' or 'circuit.' The 'module' may be the smallest unit of an integrated component or a part thereof. The 'module' may be the smallest unit that performs one or more functions or a part thereof. The 'module' may be mechanically or electronically implemented. For example, the 'module' according to various embodiments of the present disclosure may include at least one of the following: application-specific integrated circuit (ASIC) chips, field-programmable gate arrays (FPGAs), and programmable-logic devices for performing certain operations, which are now known or will be developed in the future.

At least part of the method (e.g., operations) or system (e.g., modules or functions) according to various embodiments of the present disclosure can be implemented with instructions as programming modules that are stored in computer-readable storage media. One or more processors can execute instructions, thereby performing the functions. An example of the computer-readable storage media may be storage 130. At least part of the programming modules can be implemented (executed) by a processor. At least part of the programing module may include modules, programs, routines, sets of instructions or processes, etc., in order to perform one or more functions.

Examples of computer-readable media include: magnetic media, such as hard disks, floppy disks, and magnetic tape; optical media such as Compact Disc Read Only Memory (CD-ROM) disks and Digital Versatile Disc (DVD); magneto-optical media, such as floptical disks; and hardware devices that are specially configured to store and perform program instructions (e.g., programming modules), such as read-only memory (ROM), random access memory (RAM), flash memory, etc. Examples of program instructions include machine code instructions created by assembly languages, such as a compiler, and code instructions created by a high-level programming language executable in computers using an interpreter, etc. The described hardware devices may be configured to act as one or more software modules in order to perform the operations and methods described above, or vice versa.

Modules or programming modules according to various embodiments of the present disclosure may include one or more components, remove part of them described above or include new components. The operations performed by modules, programming modules, or the other components, according to various embodiments of the present disclosure, may be executed in serial, parallel, repetitive or heuristic fashion. Part of the operations can be executed in any other order, skipped, or executed with additional operations.

The embodiments of the present disclosure described in the description and drawings are merely provided to assist in a comprehensive understanding of the disclosure and are not suggestive of limitation. Although embodiments of the disclosure have been described in detail above, it should be understood that many variations and modifications of the basic inventive concept herein described, which may be apparent to those skilled in the art, will still fall within the spirit and scope of the embodiments of the disclosure as defined in the appended claims.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of managing a battery installed in an electronic device, the method comprising:
   obtaining an internal resistance of the battery, while the battery is charging;
   determining, by a processor of the electronic device, a danger level of the battery by comparing the obtained internal resistance of the battery to a plurality of ranges while the battery is charging;
   when the battery is within a first danger level, determining whether to reduce a charging current flowing to the battery while the battery is charging or reduce a predetermined full charge voltage setting of the battery to a lower level while the battery is charging; and
   when the battery is within a second danger level, stopping the battery from charging,
   wherein in response to determining to reduce the charging current, reducing the charging current flowing to the battery while the battery is charging, and
   wherein in response to determining to reduce the predetermined full charge voltage setting, reducing the predetermined full charge voltage setting of the battery to a lower level.

2. The method of claim 1, further comprising:
   when the battery is within a third danger level, determining whether the obtained internal resistance is within a predetermined resistance range for a functioning state, while the battery is charging; and
   displaying a message when the obtained internal resistance is outside the predetermined resistance range for the functioning state.

3. The method of claim 1, further comprising when the battery is within a third danger level, turning the electronic device off and stopping the battery from charging.

4. The method of claim 1, wherein stopping the battery from charging comprises setting a present voltage of the battery to a predetermined voltage, while the battery is charged by a constant current.

5. The method of claim 4, wherein the predetermined voltage is a full charge voltage.

6. The method of claim 1, wherein reducing the predetermined full charge voltage setting, further comprising reducing the predetermined full charge voltage setting to a voltage between a present voltage of the predetermined full charge voltage setting.

7. The method of claim 1, wherein reducing the predetermined full charge voltage setting, further comprising setting a full charge voltage level of the battery that is less than the predetermined full charge voltage.

8. The method of claim 1, wherein determining the danger level of the battery comprises determining whether the internal resistance is within at least one of one of the plurality of ranges: wherein the plurality of ranges include a first predetermined resistance range for a functioning state, a second predetermined resistance range indicating a low level of danger, or a third predetermined resistance range indicating a high level of danger; and
wherein the method further comprises:
responsive to determining that the internal resistance of the battery is within one of the predetermined resistance ranges, performing at least one of: reducing a charging current flowing into the battery, setting the predetermined full charge voltage of the battery to a voltage less than the predetermined full charge voltage, or stopping the battery from charging when the voltage of the battery reaches predetermined the full charge voltage while the battery is charged with a constant current; and
responsive to determining that the internal resistance of the battery is within another predetermined resistance range, stopping the battery from charging.

9. The method of claim 1, further comprising when the battery is within a third danger level, outputting audible information through a speaker.

10. An electronic device comprising:
a battery;
an interface unit configured to receive a charging current from an external source;
a power management unit configured to charge the battery with the charging current;
a resistance obtaining unit configured to obtain an internal resistance of the battery while the battery is charging;
a display; and
at least one processor coupled to the battery, the interface unit, the power management unit, the resistance obtaining unit, wherein the at least one processor is configured to:
determine a danger level of the battery by comparing the obtained internal resistance of the battery to a plurality of ranges, while the battery is charging;
when the battery is within a first danger level, determining whether to reduce a charging current flowing to the battery while the battery is charging or reduce a predetermined full charge voltage setting of the battery to a lower level while the battery is charging; and
when the battery is within a second danger level, stopping the battery from charging,
wherein in response to determining to reduce the charging current, reducing the charging current flowing to the battery while the battery is charging, and
wherein in response to determining to reduce the predetermined full charge voltage setting, reducing the predetermined full charge voltage setting of the battery to a lower level.

11. The electronic device of claim 10, wherein the processor is further configured to:
when the battery is within a third danger level determine whether the internal resistance is within a predetermined resistance range for a functioning state, while the battery is charging; and
control the display to display a message, when the obtained internal resistance is outside the a predetermined resistance range for the functioning state.

12. The electronic device of claim 10, wherein the processor is further configured to when the battery is within a third danger level, turning the electronic device off and control the power management unit to stop the battery from charging.

13. The electronic device of claim 10, wherein to reduce the predetermined full charge voltage setting, the processor is further configured to control the power management unit to reduce the predetermined full charge voltage setting to a voltage between a present voltage of the predetermined full charge voltage setting.

14. The electronic device of claim 10, wherein:
to reduce the predetermined full charge voltage setting, the processor is further configured to set a full charge voltage level of the battery that is less than the predetermined full charge voltage; and
the processor is further configured to set a present voltage level of the battery to a predetermined voltage, while the battery is charged by a constant current.

15. The electronic device of claim 10, wherein the resistance obtaining unit is configured as an element of the power management unit.

16. The electronic device of claim 10, wherein the resistance obtaining unit is configured as an element of the processor.

17. A non-transitory computer-readable storage medium embodying a computer program, the computer program comprising program code that when executed by at least one processor causes the at least one processor to:
obtain an internal resistance of a battery, while the battery is charging in an electronic device;
determine a danger level of the battery by comparing the obtained internal resistance of the battery to a plurality of ranges, while the battery is charging;
when the battery is within a first danger level, determining whether to reduce a charging current flowing to the battery while the battery is charging or reduce a predetermined full charge voltage setting of the battery to a lower level while the battery is charging; and
when the battery is within a second danger level, stopping the battery from charging,
wherein in response to determining to reduce the charging current, reducing the charging current flowing to the battery while the battery is charging, and
wherein in response to determining to reduce the predetermined full charge voltage setting, reducing the predetermined full charge voltage setting of the battery to a lower level.

18. The non-transitory computer-readable storage medium of claim 17, wherein when the battery is within a third danger level, the non-transitory computer-readable storage medium further comprises program code that when executed by the at least one processor of the electronic device, causes the at least one processor to:

determine whether the obtained internal resistance is within a predetermined resistance range for a functioning state, while the battery is charging; and display a message when the obtained internal resistance is outside the predetermined resistance range for the functioning state.

19. The non-transitory computer-readable storage medium of claim 17, further comprising program code that when executed by the at least one processor of the electronic device, causes the at least one processor to turn the electronic device off and stop the battery from charging when the battery is within a third danger level.

20. The non-transitory computer-readable storage medium of claim 19, wherein to stop the battery from charging, the non-transitory computer-readable storage medium further comprising program code that when executed by the at least one processor of the electronic device, causes the at least one processor to set a present voltage of the battery to a predetermined voltage, while the battery is charged by a constant current.

* * * * *